(12) United States Patent
Kerber et al.

(10) Patent No.: US 9,391,198 B2
(45) Date of Patent: Jul. 12, 2016

(54) STRAINED SEMICONDUCTOR TRAMPOLINE

(71) Applicant: International Business Machines Corporation, Armonk, NY (US)

(72) Inventors: Pranita Kerber, Mount Kisco, NY (US); Qiqing C. Ouyang, Yorktown Heights, NY (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 22 days.

(21) Appl. No.: 14/483,230

(22) Filed: Sep. 11, 2014

(65) Prior Publication Data

US 2016/0079419 A1 Mar. 17, 2016

(51) Int. Cl.
*H01L 27/12* (2006.01)
*H01L 29/78* (2006.01)
*H01L 29/66* (2006.01)
(Continued)

(52) U.S. Cl.
CPC ...... *H01L 29/7842* (2013.01); *H01L 21/02381* (2013.01); *H01L 21/02532* (2013.01); *H01L 21/304* (2013.01); *H01L 21/30604* (2013.01); *H01L 21/31* (2013.01); *H01L 21/31111* (2013.01); *H01L 29/0649* (2013.01); *H01L 29/1054* (2013.01); *H01L 29/16* (2013.01);
(Continued)

(58) Field of Classification Search
CPC ............... H01L 21/84; H01L 27/1203; H01L 21/02532; H01L 21/823878; H01L 21/76283; H01L 27/1207; H01L 29/78603; H01L 21/76224; H01L 21/76264; H01L 21/02664; H01L 21/76286; H01L 21/7624
See application file for complete search history.

(56) References Cited

U.S. PATENT DOCUMENTS 6,613,652 B2  9/2003  Lim et al.
6,900,502 B2  5/2005  Ge et al.
(Continued)

FOREIGN PATENT DOCUMENTS

WO      02080241 A1    10/2002
WO    2004061921 A3     7/2004
WO    2005096372 A1    10/2005

OTHER PUBLICATIONS

Cheng et al., "Relaxed Silicon-Germanium on Insulator (SGOI)", Mat. Res. Soc. Symp. Proc. vol. 686 © 2002 Materials Research Society, pp. A1.5.1-A1.5.6.
(Continued)

*Primary Examiner* — John C Ingham
*Assistant Examiner* — Frederick B Hargrove
(74) *Attorney, Agent, or Firm* — Yuanmin Cai, Esq.

(57) ABSTRACT

A method of forming a strained trampoline including: forming a strain inducing layer on a semiconductor-on-insulator (SOI), the SOI having a semiconductor layer on an insulator layer and the insulator layer is on a handle substrate; forming a opening through the semiconductor layer and the insulator layer using a patterned hardmask; forming a trampoline support in the opening; forming a trench through the strain inducing layer and through the semiconductor layer exposing a portion of the insulator layer, a strained trampoline is a portion of the semiconductor layer with a boundary defined by the trampoline support and the trench; and removing the insulator layer through the trench, where the strained trampoline is supported by the trampoline support.

17 Claims, 8 Drawing Sheets

(51) Int. Cl.
*H01L 29/10* (2006.01)
*H01L 21/31* (2006.01)
*H01L 21/306* (2006.01)
*H01L 21/311* (2006.01)
*H01L 21/304* (2006.01)
*H01L 29/06* (2006.01)
*H01L 29/16* (2006.01)
*H01L 29/161* (2006.01)
*H01L 21/02* (2006.01)

(52) U.S. Cl.
CPC ........ *H01L 29/161* (2013.01); *H01L 29/66477* (2013.01)

(56) References Cited

U.S. PATENT DOCUMENTS

| | | | |
|---|---|---|---|
| 7,078,298 B2 | 7/2006 | Lee et al. | |
| 7,211,458 B2 | 5/2007 | Ozturk et | |
| 7,354,809 B2 | 4/2008 | Yuan et al. | |
| 7,619,300 B2 | 11/2009 | Ieong et al. | |
| 8,368,143 B2 | 2/2013 | Bedell et al. | |
| 8,450,806 B2 | 5/2013 | Furukawa et al. | |
| 8,492,235 B2 | 7/2013 | Toh et al. | |
| 2004/0253792 A1* | 12/2004 | Cohen | H01L 21/76264 438/400 |
| 2005/0106790 A1* | 5/2005 | Cheng | H01L 21/02381 438/172 |
| 2009/0001415 A1 | 1/2009 | Lindert et al. | |
| 2014/0011328 A1 | 1/2014 | Bedell et al. | |

OTHER PUBLICATIONS

Jurczak et al., "Silicon-on-Nothing (SON)—an Innovative Process for Advanced CMOS", IEEE Transactions on Electron Devices, vol. 47, No. 11, Nov. 2000, pp. 2179-2187.

* cited by examiner

STRAINED SEMICONDUCTOR TRAMPOLINE

BACKGROUND

The present invention generally relates to semiconductor devices, and more particularly, to a method of fabricating suspended strained silicon for field-effect transistors (FET) and related devices.

Developments in silicon-based integrated circuit technology, including FET technology, have provided greater device speed, increased integration density, and/or improved functionality. However, as transistor dimensions continue to scale-down, a variety of operational and structural problems may arise. For example, as the channel length of a transistor is reduced, short-channel effects such as punch-through, drain induced barrier lowering (DIBL), and increased leakage current may occur.

Alternative transistor designs are being developed to address problems associated with shrinking device dimensions while improving transistor performance. One alternative design involves the use of strained silicon in the channel region of the transistor. Strain may be created in crystalline silicon by applying layers of other materials to physically elongate or compress bonds between the crystal's atoms. For example, germanium atoms may replace some of the silicon atoms near a surface of a silicon wafer, and a thin layer of silicon may be grown on top of this silicon-germanium (SiGe) layer. Because germanium atoms are larger than silicon atoms, the distance between the atoms in the silicon-germanium lattice is greater than it is in pure silicon. As such, when a silicon layer is grown on top of a silicon germanium layer, the silicon atoms may line-up with the silicon-germanium lattice below, which may increase the distance between silicon atoms and thereby create strain in the silicon layer. This strain may enable electrical charges to pass more easily through the silicon lattice. Thus, carrier mobility may be increased in a transistor having a strained silicon channel region.

SUMMARY

According to one embodiment of the present invention, a method of forming a strained trampoline is provided. The method may include forming a strain inducing layer on a semiconductor-on-insulator (SOI), the SOI is a semiconductor layer, an insulator layer, and a handle substrate, wherein the semiconductor layer is on the insulator layer and the insulator layer is on the handle substrate, the strain inducing layer is a material with a different atomic alignment than the atomic alignment of the semiconductor layer, wherein the strain inducing layer places a strain on the semiconductor layer; forming a hardmask on the strain inducing layer; patterning the hardmask; forming a opening through the semiconductor layer and through the insulator layer using the patterned hardmask as a mask; forming a trampoline support in the opening; forming a trench through the strain inducing layer and through the semiconductor layer, the trench exposes a portion of the insulator layer, the trench is adjacent to the trampoline support, a strained trampoline is a portion of the semiconductor layer with a boundary defined by the trampoline support and the trench; and removing the insulator layer from beneath the strained trampoline through the trench, wherein the strained trampoline is supported by the trampoline support.

According to another embodiment of the present invention, a method of forming a strained trampoline is provided. The method may include forming a strain inducing layer on a silicon-on-insulator (SOI), the SOI is a silicon layer, a buried oxide (BOX) layer, and a handle substrate, wherein the silicon layer is on the BOX layer and the BOX layer is on the handle substrate; forming an opening through the silicon layer and through the BOX layer; forming a trampoline support in the opening; forming a trench in through the silicon layer and through the BOX layer, the trench is adjacent to the trampoline support, a strained silicon trampoline is a portion of the silicon layer with a boundary defined by the trampoline support and the trench; and removing the BOX layer from beneath the strained silicon trampoline.

According to another embodiment of the present invention, a structure of a strained trampoline is provided. The structure may include a strained trampoline physically held in a strained state by a trampoline support, the strained trampoline is vertically suspended by the trampoline support; and a handle substrate physically supporting the trampoline support.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor devices, and more particularly, to a method of fabricating suspended strained silicon for field-effect transistors (FET) and related devices. Ideally, it may be desirable to strain a silicon layer in multiple directions in a FET device without adding additional straining layers and with the ability to remove the straining material(s) without relaxing the silicon. One way to strain a silicon layer in multiple directions is to form a strained trampoline (i.e., suspended layer or floating island) suspended or supported and held in a strained state (i.e., alignment) by a trampoline support. One embodiment by which to form a strained trampoline is described in detail below with reference to the accompanying drawings FIGS. 1-12. Alternative embodiments of the strained trampoline is described in detail below with reference to the accompanying drawings FIGS. 13-16.

Strained silicon may be a layer of silicon where silicon atoms are stretched beyond their normal inter-atomic distance. Strained silicon may increase electron mobility due to the resulting change in the band structure of the silicon. The strain may be caused by a lattice mismatch between layers, such as, silicon (Si) and silicon-germanium (SiGe). When silicon and silicon-germanium layers are in contact, the silicon atoms align with the further separated silicon-germanium atoms. The lattice constant of the silicon-germanium may be larger than the lattice constant of silicon due to the tetragonal distortion of the silicon-germanium material. The silicon-germanium may, therefore, impose its lengthened vertical cell dimension on the already smaller cell dimension of the silicon layer, imparting a strain on the silicon layer. The exemplary embodiments discussed in turn below may include the use of silicon and silicon-germanium, specifically, but other materials, or combinations of materials, may be implemented.

Figure 1:
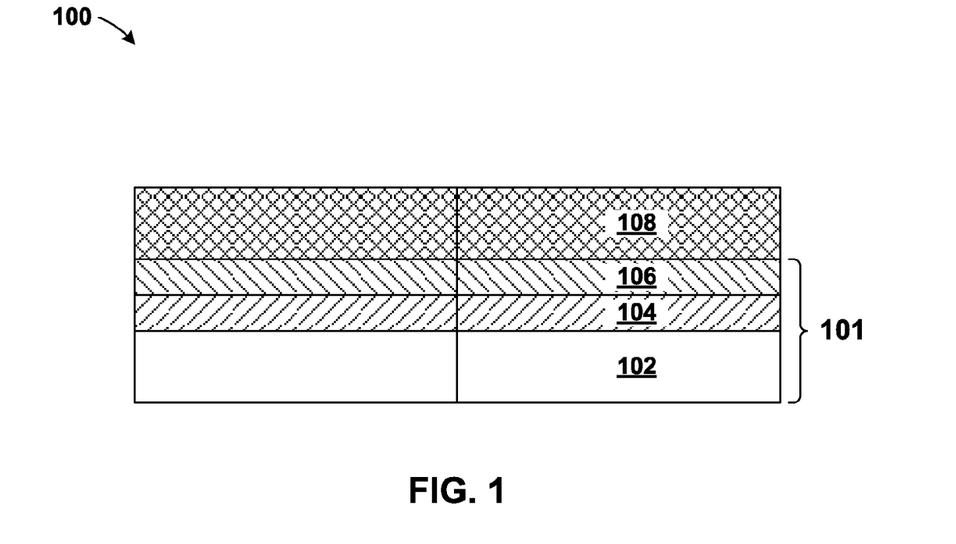
FIG. 1 is a cross section view of a semiconductor structure, according to an exemplary embodiment.
Figure 2:
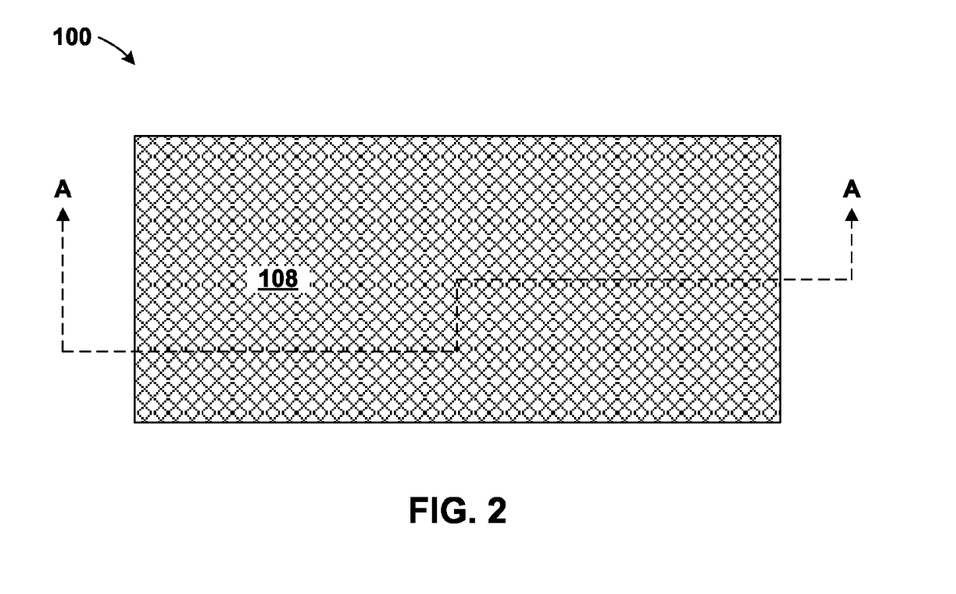
FIG. 2 is a top view of the semiconductor structure illustrated in FIG. 1, according to an exemplary embodiment.

FIGS. 1 and 2 are demonstrative illustrations of a structure 100 during an intermediate step of a method of fabricating a strained trampoline according to an exemplary embodiment. More specifically, the method can start with fabricating a strain inducing layer 108 on a semiconductor layer 106. FIG. 1 is a cross section view of the structure 100 illustrated in FIG. 2 taken along section line A-A.

In an exemplary embodiment, the structure 100 may include; a handle substrate 102, an insulator layer 104, and the semiconductor layer 106, in order from bottom to top. Collectively, the handle substrate 102, the insulator layer 104, and the semiconductor layer 106, may be referred to as a semiconductor-on-insulator (SOI) substrate 101. It should be noted, the SOI substrate may also be referred to as a silicon-on-insulator substrate. The insulator layer 104 may also be referred to as a buried dielectric layer or a buried oxide (BOX) layer. In the embodiment, the semiconductor layer 106 is present on a top surface of the insulator layer 104, and the insulator layer 104 is present on a top surface of the handle substrate 102. The handle substrate 102 may provide mechanical support to the insulator layer 104 and the semiconductor layer 106.

The SOI substrate 101 may be formed using standard techniques known in the art, such as, for example, Separation by Ion Implantation of Oxygen (SIMOX) or layer transfer. When a layer transfer process is employed, an optional thinning step may follow the bonding of two semiconductor wafers together. The optional thinning step can reduce the thickness of a layer to a desirable thickness.

Although the present embodiment is described and illustrated utilizing an SOI structure, other semiconductor substrates can also be used including, for example, a semiconductor substrate in which the handle substrate 102 is omitted, or a bulk semiconductor substrate in which the entirety of the semiconductor substrate includes a semiconductor material.

In some embodiments, the handle substrate 102 and the semiconductor layer 106 may include a same or similar semiconductor material. In other embodiments, the handle substrate 102 and the semiconductor layer 106 may include a different semiconductor material. The term "semiconductor" as used herein in connection with the semiconductor material of the handle substrate 102 and the semiconductor layer 106 may denote any semiconducting material including, for example, Si, Ge, SiGe, SiC, SiGeC, InAs, GaAs, InP or other like III/V compound semiconductors. Multi-layers of these semiconductor materials can also be used as the semiconductor material of the handle substrate 102 and the semiconductor layer 106. In an embodiment, the handle substrate 102 and the semiconductor layer 106 both include silicon. In some embodiments, the handle substrate 102 is a non-semiconductor material including, for example, a dielectric material and/or a conductive material.

In an embodiment, the handle substrate 102 and the semiconductor layer 106 may have the same or different crystal orientation. For example, the crystal orientation of the handle substrate 102 and/or the semiconductor layer 106 may be {100}, {110}, or {111}. Other crystallographic orientations besides those specifically mentioned can also be used. The handle substrate 102 and/or the semiconductor layer 106 of the SOI substrate 101 may be a single crystalline semiconductor material, a polycrystalline material, or an amorphous material. Typically, at least the semiconductor layer 106 is a single crystalline semiconductor material. In some embodiments, the semiconductor layer 106 that is located above the insulator layer 104 can be processed to include semiconductor regions having different crystal orientations.

The thickness of semiconductor layer 106 may be typically from 5 nm to 100 nm. In an embodiment, the thickness of the semiconductor layer 106 may be between 5 nm to 10 nm. In some embodiments, when an extremely thin semiconductor-on-insulator (ETSOI) substrate is employed, the semiconductor layer 106 can have a thickness of less than 5 nm. If the thickness of the semiconductor layer 106 is not within one of the above mentioned ranges, a thinning step such as, for example, planarization or etching can be used to reduce the thickness of semiconductor layer 106 to a desired thickness.

The semiconductor layer 106 may be doped, undoped or contain doped and undoped regions therein. For clarity, the doped regions are not specifically shown in the drawings of the present embodiment. Each doped region within the semiconductor layer 106 may have the same, or may have different, conductivities and/or doping concentrations. The doped regions that are present in the semiconductor layer 106 can be formed by ion implantation process or gas phase doping.

With continued reference to FIGS. 1 and 2, the insulator layer 104 may be a crystalline or non-crystalline oxide or nitride. In an embodiment, the insulator layer 104 is an oxide such as, for example, silicon dioxide. The insulator layer 104 may be continuous or discontinuous. The insulator layer 104 may typically have a thickness from 1 nm to 200 nm. In an embodiment, the insulator layer 104 may have a thickness ranging from about 10 nm to 100 nm. In an alternative embodiment, the insulator layer 104 may include multiple dielectric layers or a stack of dielectric layers including a silicon oxide layer and a silicon nitride layer.

The strain inducing layer 108 may be formed on the semiconductor layer 106 using any method known in the art, such as, for example, epitaxial growth or deposition. The terms "epitaxial growth and/or deposition" and "epitaxially formed and/or grown" means the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

The strain inducing layer 108 may be any straining material known in the art, such as, for example, germanium or carbon compounds. In an embodiment the strain inducing layer 108 may be SiGe with 20% to 35% Ge. Good straining materials may generally include characteristics, such as, for example, a similar (but slightly different) lattice structure as silicon and/or a similar (but slightly different) lattice constant within ±4%. The strain inducing layer 108 may have a thickness ranging from about 25 nm to about 50 nm. The relatively thicker strain inducing layer 108 may more evenly and completely strain the relatively thinner semiconductor layer 106 once the strain inducing layer 108 is deposited or grown on the semiconductor layer 106. In the exemplary embodiment, and as stated above, the silicon atoms of the semiconductor layer 106 may align with the silicon atoms of the strain inducing layer 108, therefore, inducing a strain on the semiconductor layer 106.

Figure 3:
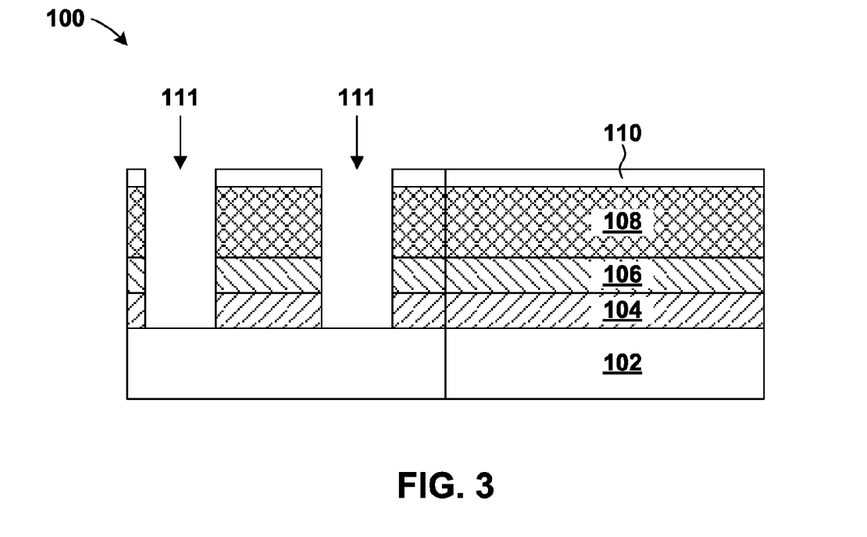
FIG. 3 is a cross section view of the semiconductor structure and illustrates the formation of an opening, according to an exemplary embodiment.
Figure 4:
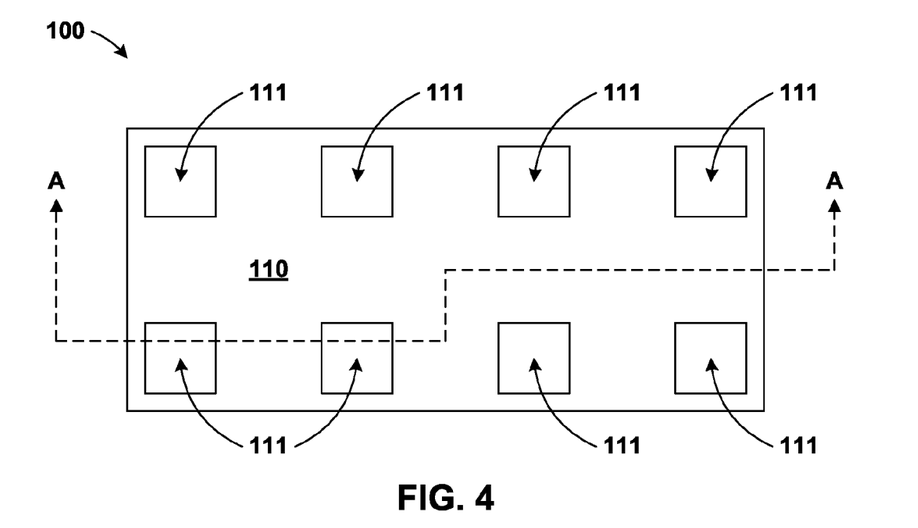
FIG. 4 is a top view of the semiconductor structure illustrated in FIG. 3, according to an exemplary embodiment.
Figure 5:
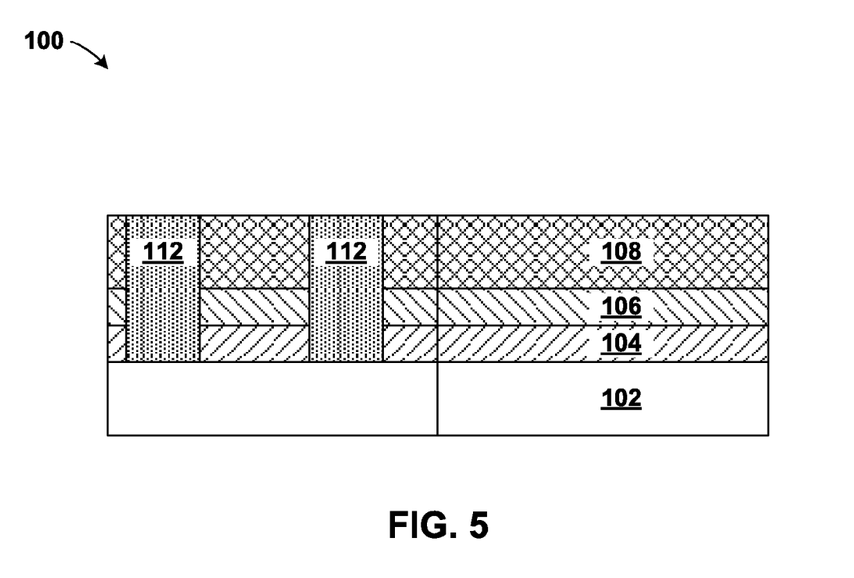
FIG. 5 is a cross section view of the semiconductor structure and illustrates the formation of a trampoline support in the opening, according to an exemplary embodiment.

FIGS. 3-6 are demonstrative illustrations of the structure 100 during an intermediate step of a method of fabricating the strained trampoline according to an exemplary embodiment. More specifically, the method may include forming a trampoline support 112. FIGS. 3 and 5 are cross section views of the structure 100 illustrated in FIGS. 4 and 6, respectively, taken along section lines A-A.

The trampoline support 112 may be formed in an opening 111 formed in the strain inducing layer 108 and in the semiconductor layer 106. The opening 111 may be formed using any technique known in the art, such as, for example, patterning and etching a mask on a semiconductor material and transferring the pattern into the semiconductor material using an etching technique, such as an anisotropic etch. In an embodiment, a hardmask 110 may be used to form the opening 111. It should be noted the opening 111, and the trampoline support 112 thereafter, may wrap around a portion of the semiconductor layer 106.

The hardmask 110 may be formed on the strain inducing layer 108 using any deposition technique known in the art, such as, for example, chemical vapor deposition, plasma enhanced chemical vapor deposition, atomic layer deposition, or physical vapor deposition. The hardmask 110 may include any masking material known in the art, such as, for example, silicon nitride ($Si_3N_4$), silicon carbide (SiC), silicon carbon nitride (SiCN), hydrogenated silicon carbide (SiCH), or any other masking material. A support pattern may be etched in the hardmask 110. The opening 111 may be formed by transferring the support pattern from the hardmask 110 into the strain inducing layer 108, the semiconductor layer 106, and the insulator layer 104. The opening 111 should extend into, at least, a portion of the insulator layer 104. Alternatively, the opening 111 may be formed by transferring the support pattern through the strain inducing layer 108, the semiconductor layer 106, and the insulator layer 104, where the handle substrate 102 acts as an etch stop. Stated differently, the support pattern may be transferred through the strain inducing layer 108, the semiconductor layer 106, and the insulator layer 104 selective to the handle substrate 102.

Figure 6:
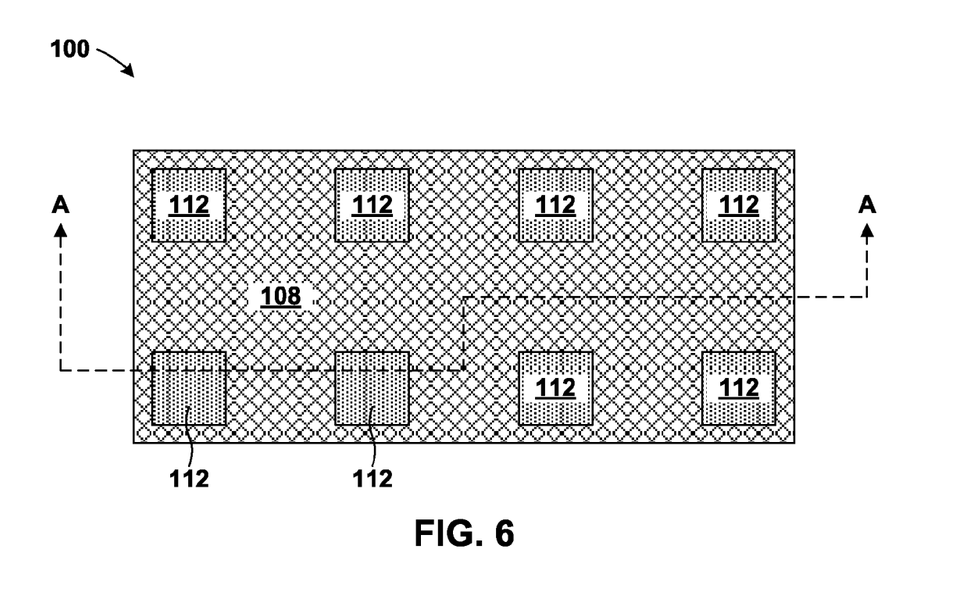
FIG. 6 is a top view of the semiconductor structure illustrated in FIG. 5, according to an exemplary embodiment.

A trampoline support 112 may be formed in the opening 111 using any deposition, epitaxial growth, or other technique known in the art. The trampoline support 112 may be any material known in the art having different etch properties than the insulator layer 104. Different material properties between the trampoline support 112 and the insulator layer 104 will be relevant during subsequent material removal steps. More specifically, the trampoline support 112 may be made from a material that may allow for the selective removal of the insulating layer 104. In an embodiment, the trampoline support 112 may be made from silicon using an epitaxial growth technique to form a silicon trampoline support in the openings 111. The trampoline support 112 may be planarized or etched to any surface above a bottom surface of the semiconductor layer 106. The trampoline support 112 may contact a vertical surface of the semiconductor layer 106 to provide vertical and/or horizontal support to the semiconductor layer 106. In the exemplary embodiment, the trampoline support 112 is planarized to a top surface of the strain inducing layer 108. The semiconductor layer 106 may be in a strained state (atomic alignment) when the trampoline support 112 is formed, which may set a baseline strained state. The semiconductor layer 106 may remain in the strained state during subsequent removal of the strain inducing layer 108 and the insulator layer 104 (i.e., without relaxing the semiconductor layer 106) because of the support of the trampoline support 112. It should be noted a single trampoline support 112 may be employed as long as the trampoline support 112 can support the semiconductor layer 106 in the strained state. In the exemplary embodiment, four trampoline supports 112 may be employed for a device region, where adjacent device regions may share adjacent trampoline supports 112.

Figure 7:
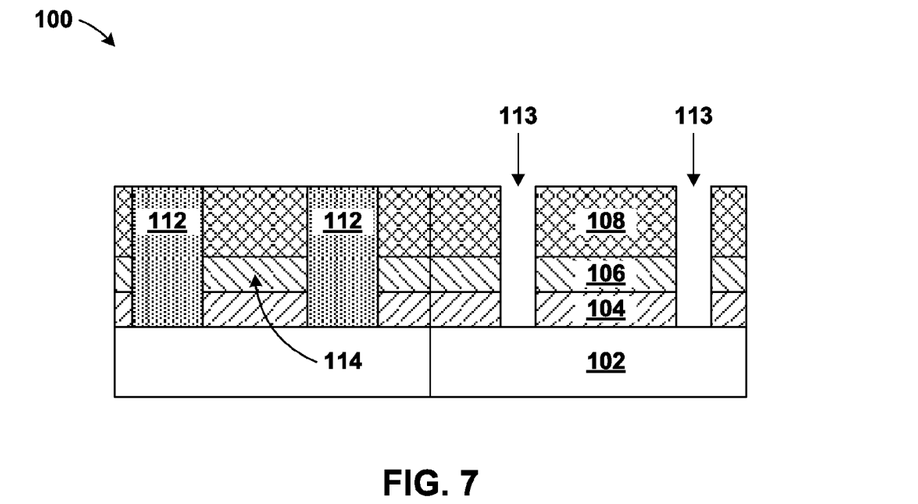
FIG. 7 is a cross section view of the semiconductor structure and illustrates the formation of a trench adjacent to the trampoline support, according to an exemplary embodiment.
Figure 8:
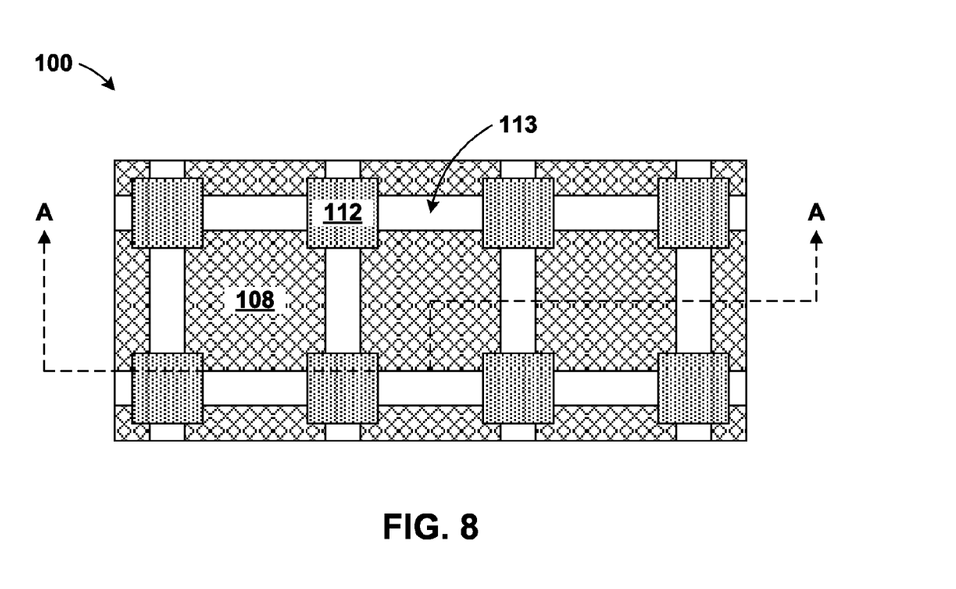
FIG. 8 is a top view of the semiconductor structure illustrated in FIG. 7, according to an exemplary embodiment.

FIGS. 7 and 8 are demonstrative illustrations of the structure 100 during an intermediate step of a method of fabricating the strained trampoline according to an exemplary embodiment. More specifically, the method may include forming a trench 113 through the semiconductor layer 106. FIG. 7 is a cross section view of the structure 100 illustrated in FIG. 8 taken along section line A-A.

The trench 113 may be formed using any etching techniques known in the art, such as, for example, depositing a second hardmask on the strain inducing layer 108, patterning the second hardmask, and etching through the strain inducing layer 108, the semiconductor layer 106, and the insulator layer 104. The trench 113 may be formed to the top surface of the insulator layer 104 or any surface below the top surface of the insulator layer 104, the trench 113 should expose the insulator layer 104 to allow for subsequent removal of the insulator layer 104 through the trench 113. It should be noted, the formation of the trampoline support 112 and/or the trench 113 may define a boundary of a strained trampoline 114 (i.e., the strained trampoline 114 may be bordered on all sides by the trampoline support 112 and/or the trench 113). The strained trampoline 114 may be a portion of the semiconductor layer 106 defined by the trampoline support 112 and/or the trench 113. In the exemplary embodiment, four trenches 113 and four trampoline supports 112 define the boundary of the strained trampoline 114. The four trenches 113 run adjacent to the strained trampoline and reach between two of the four trampoline supports 112. Each of the four trenches 113 separate the strained trampoline 114 from adjacent strained trampolines.

Figure 9:
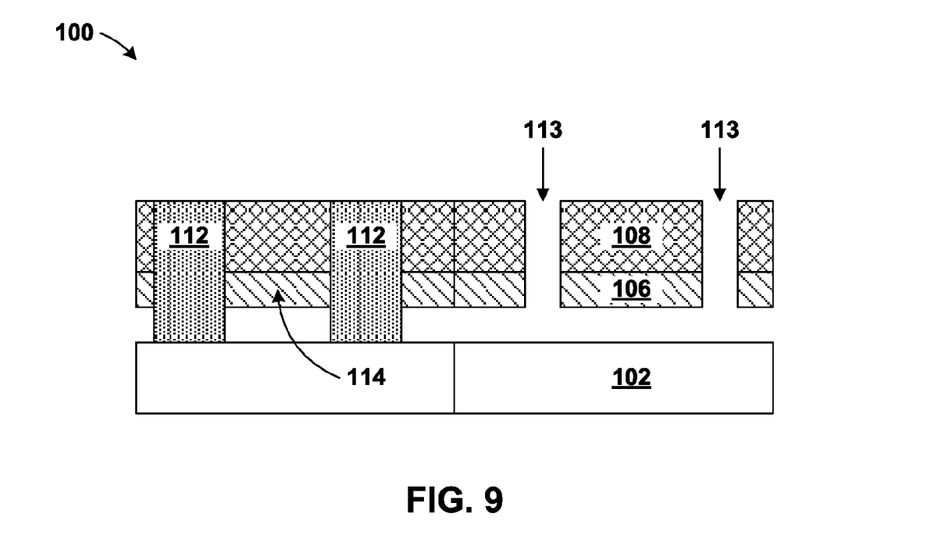
FIG. 9 is a cross section view of the semiconductor structure and illustrates the removal of an insulator layer from underneath a semiconductor layer, according to an exemplary embodiment.
Figure 10:
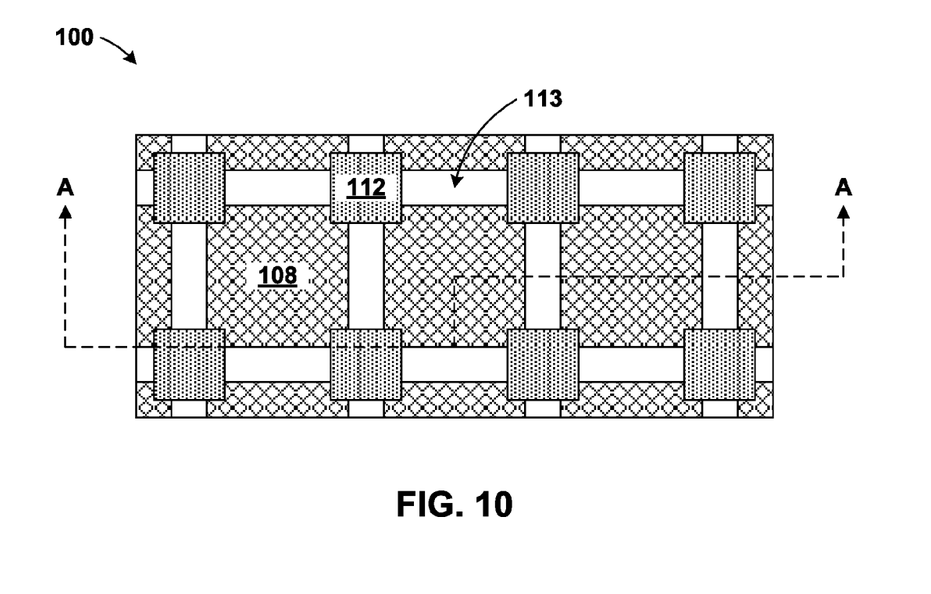
FIG. 10 is a top view of the semiconductor structure illustrated in FIG. 9, according to an exemplary embodiment.

FIGS. 9 and 10 are demonstrative illustrations of the structure 100 during an intermediate step of a method of fabricating the strained trampoline 114 according to an exemplary embodiment. More specifically, the method may include removing the insulator layer 104 from underneath the strained trampoline 114. FIG. 9 is a cross section view of the structure 100 illustrated in FIG. 10 taken along section line A-A.

The insulator layer 104 may be removed using any etching technique capable of horizontal etching below other materials, such as, for example, wet etching of oxide underneath a silicon layer. The insulator layer 104 may be accessed and thus removed through the trench 113, as stated above. The removal of the insulator layer 104 may allow for straining of the semiconductor layer 106 in multiple directions without using another straining material or other straining methods currently used. The strain shared between the relatively thicker strain inducing layer 108 and the relatively thinner semiconductor layer 106 may be higher after removal of the insulator layer 104 because the semiconductor layer 106 no longer has the added support of the insulator layer 104, where the semiconductor layer 106 is still supported by the trampoline support 112. In an embodiment, the strain inducing layer 108 may be about five times thicker than the semiconductor layer 106, allowing for additional strain to be added after removal of the insulator layer 104. Once the insulator layer 104 is removed, the strained trampoline 114 may be in a suspended strained state supported by the trampoline support 112.

Figure 11:
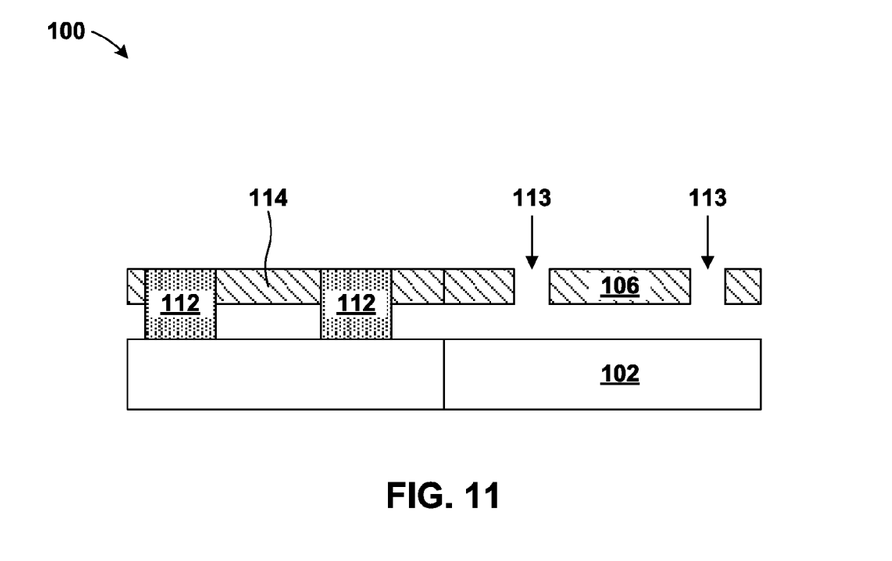
FIG. 11 is a cross section view of the semiconductor structure and illustrates the removal of a strain inducing layer, according to an exemplary embodiment.
Figure 12:
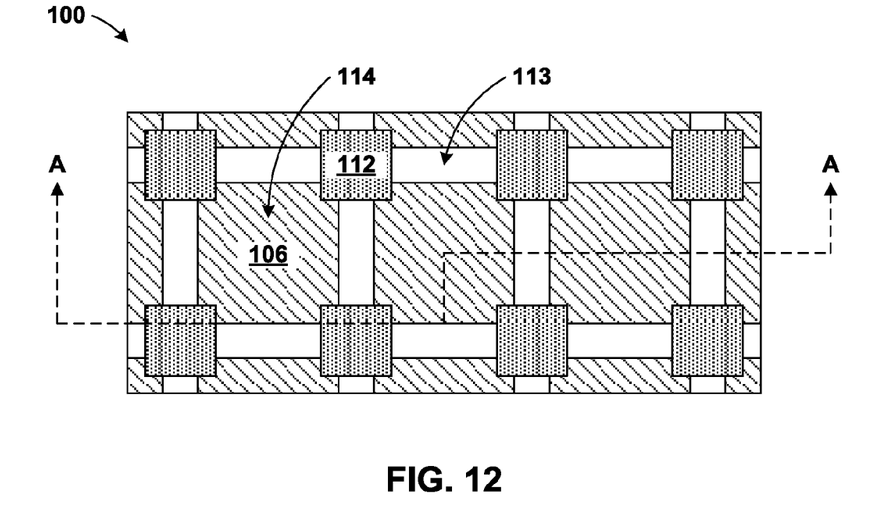
FIG. 12 is a top view of the semiconductor structure illustrated in FIG. 11, according to an exemplary embodiment.

FIGS. 11 and 12 are demonstrative illustrations of the structure 100 during an intermediate step of a method of fabricating the strained trampoline 114 according to an exemplary embodiment. More specifically, the method may include removing the strain inducing layer 108. FIG. 11 is a cross section view of the structure 100 illustrated in FIG. 12 taken along section line A-A.

In an exemplary embodiment, the strain inducing layer 108 may be removed using any method known in the art, such as for example, chemical-mechanical polishing or etching. The strained trampoline 114 may still be in the strained state after the removal of the strain inducing layer 108 due to the trampoline support 112 being formed while the semiconductor layer 106 (i.e. the strained trampoline 114) was under strain and physically restricting atom alignment relaxation. Stated differently, the trampoline support 112 may physically restrict the strained trampoline 114 from reverting to the relaxed position, even after the strain inducing layer 108 is removed. The strained trampoline 114 may remain supported by the trampoline support 112 in a suspended fashion above the handle substrate 102 such that the strained trampoline 114 does not directly contact the handle substrate 102. In an alternative embodiment, the trampoline support 112 may be completely replaced by an isolation material such as a shallow trench isolation (STI) to electrically isolate the strained trampoline 114 from adjacent device regions or other strained trampolines. It should be noted that the height of the trampoline support 112 may be simultaneously reduced during the removal of the strain inducing layer 108.

In the exemplary embodiment, the strained trampoline 114 is surrounded by the trench 113 on the sides, unsupported on the bottom, uncovered on the top, and contacts the trampoline support 112 in the corners. The strained trampoline 114 may be etched or used as a substrate, for example, in subsequent device manufacturing.

Figure 13:
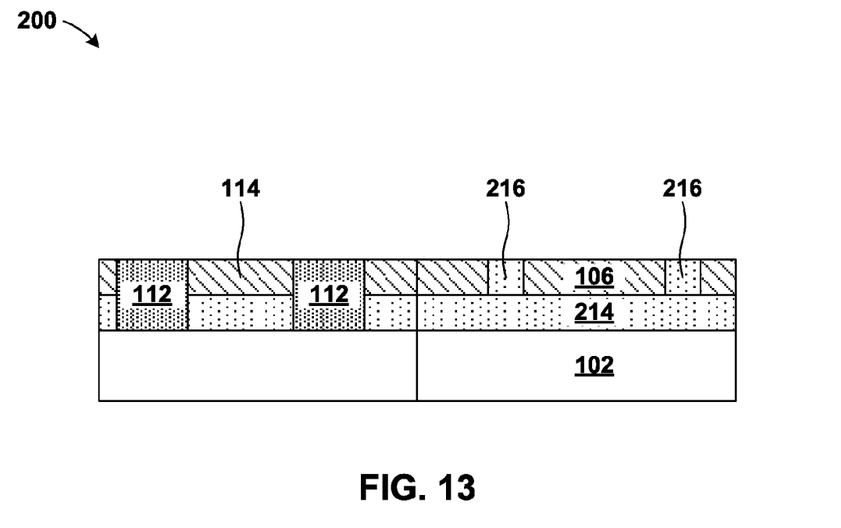
FIG. 13 is a cross section view of an alternative semiconductor structure and illustrates the formation of an oxide fill underneath the semiconductor layer and a trench fill in the trench, according to an alternative embodiment.
Figure 14:
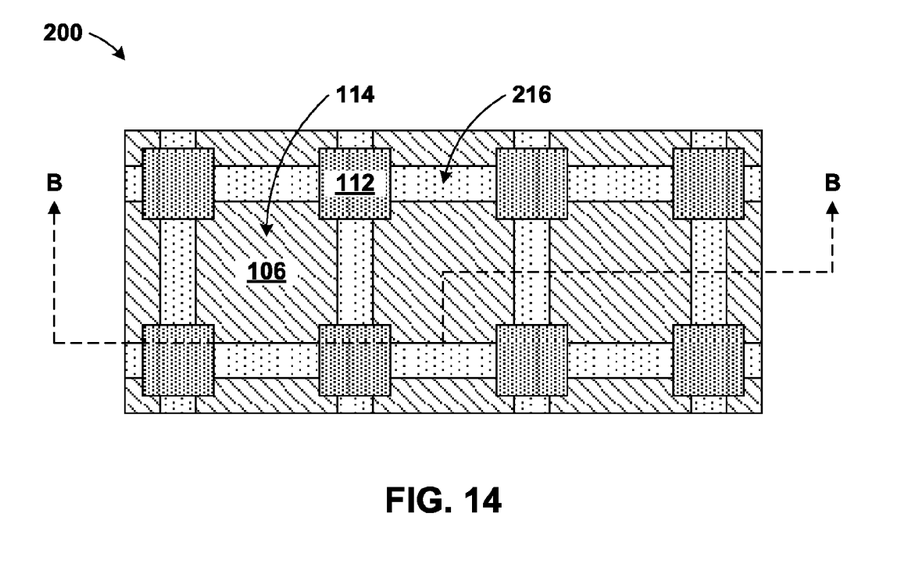
FIG. 14 is a top view of the semiconductor structure illustrated in FIG. 13, according to an alternative embodiment.

FIGS. 13 and 14 are demonstrative illustrations of a structure 200 during an intermediate step of a method of fabricating the strained trampoline 114 according to an alternative embodiment. More specifically, the method may include forming a flowable oxide 214 and a trench fill 216 underneath the strained trampoline 114 and in the trench 113, respectively. FIG. 13 is a cross section view of the structure 200 illustrated in FIG. 14 taken along section line B-B.

In an alternative embodiment, the flowable oxide 214 is formed below the strained trampoline 114 in the space between the handle substrate 102 and the strained trampoline 114. The flowable oxide 214 may be formed using any flowable deposition technique known in the art, such as, for example, spin deposition of a liquid material while spinning the wafer at high RPM's, followed by a curing period and annealing at roughly 500° C. The flowable oxide 214 may provide additional structural support without relaxing the strain in the strained trampoline 114. A low temperature oxide fill process may allow the strained trampoline 114 to stay in the strained state during and after the formation of the formation of the flowable oxide 214. The flowable oxide 214 may also provide additional electrical isolation from the handle substrate 102.

The trench fill 216 may be formed in the trench 113 (after the removal of the insulation layer 104) using any deposition and planarization technique known in the art, as described above. The trench fill 216 may be used as insulation between the strained trampoline 114 and other device regions or other strained trampolines. An alternative embodiment may include either the flowable oxide 214 or the trench fill 216, or the alternative embodiment may include both the flowable oxide 214 and the trench fill 216.

In an alternative embodiment, the strained trampoline 114 is surrounded by the trench fill 216 on the sides, has the flowable oxide 214 underneath the strained trampoline 114, uncovered on the top, and contacts the trampoline supports 112 in the corners. The strained trampoline 114 may be etched or used as a substrate, for example, in subsequent device manufacturing.

Figure 15:
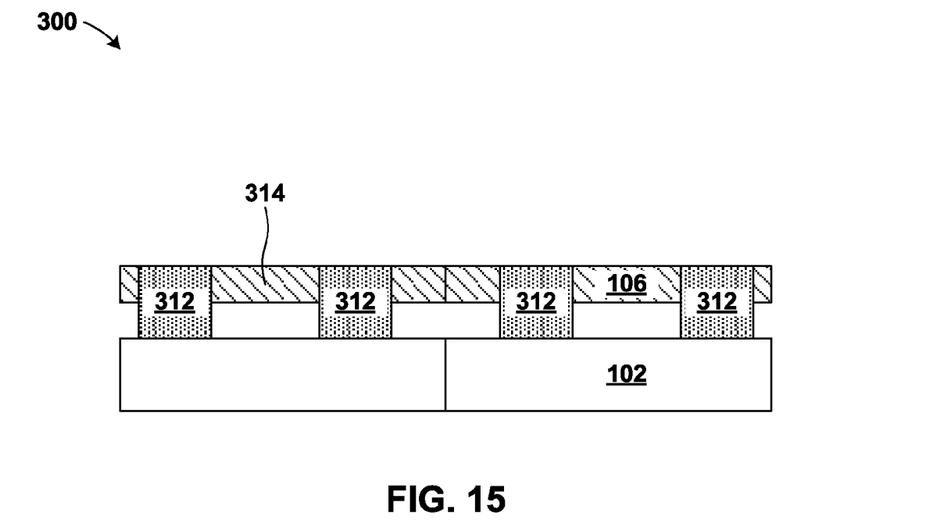
FIG. 15 is a cross section view of another alternative semiconductor structure and illustrates the formation of the trampoline support, where the trampoline support is elongated or stretch a length of a strained trampoline, according to another alternative embodiment.
Figure 16:
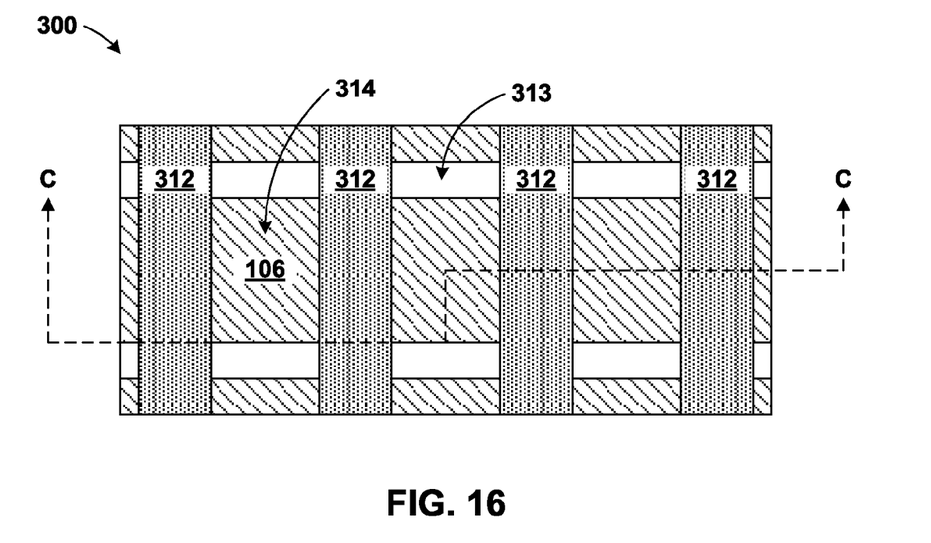
FIG. 16 is a top view of the semiconductor structure illustrated in FIG. 15, according to another alternative embodiment.

FIGS. 15 and 16 are demonstrative illustrations of a structure 300 during an intermediate step of a method of fabricating a strained trampoline 314 according to yet another alternative embodiment. More specifically, the method may include forming trampoline support 312 extending an entire length of the strained trampoline 314. FIG. 15 is a cross section view of the structure 300 illustrated in FIG. 16 taken along section line C-C.

The trampoline support 312 may be formed using the same materials and process as the trampoline support 112 described above, with reference to FIGS. 5 and 6. The trampoline support 312 may take the form of a support wall or any other support structure capable of holding strain. As the support structure, trampoline support 312 or trampoline support 112 change, the dimensions and strain directions of the strained trampoline 314 may also change. It should be noted, any variation of the embodiments may be employed in any or all of the alternative embodiments.

In the alternative embodiment, the strained trampoline 314 may have a trench 313 on two of the four sides, contact the trampoline support 312 on opposite two sides from the trench 313, a gap beneath the strained trampoline 314 between the strained trampoline 314 and the handle substrate 102, and may be uncovered on a top surface. In this alternative embodiment, the strained trampoline is supported on two sides by the strained trampoline 314. The strained trampoline 314 may be etched or used as a substrate, for example, in subsequent device manufacturing.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a strain inducing layer on a semiconductor-on-insulator (SOI), the SOI is a semiconductor layer, an insulator layer, and a handle substrate, wherein the semiconductor layer is on the insulator layer and the insulator layer is on the handle substrate, the strain inducing layer is a material with a different atomic alignment than the atomic alignment of the semiconductor layer, wherein the strain inducing layer places a strain on the semiconductor layer;
    forming a hardmask on the strain inducing layer;
    patterning the hardmask;
    forming a opening through the semiconductor layer and through the insulator layer using the patterned hardmask as a mask;
    forming a trampoline support in the opening;
    forming a trench through the strain inducing layer and through the semiconductor layer, the trench exposes a portion of the insulator layer, the trench is adjacent to the trampoline support, the semiconductor layer comprises a strained trampoline with a boundary defined by the trampoline support and the trench; and
    removing the insulator layer from beneath the strained trampoline through the trench, wherein the strained trampoline is supported by the trampoline support, wherein the trampoline support extends an entire side of the strained trampoline, wherein the strained trampoline is bordered on opposite sides by two trampoline supports and is bordered on adjacent sides by the trench, the trampoline supports and the trench define an entire boundary of the strained trampoline.

2. The method of claim 1, further comprising:
    removing the strain inducing layer; and
    polishing the trampoline support to a top surface of the strained trampoline.

3. The method of claim 1, further comprising:
    forming a flowable oxide underneath the strained trampoline after removal of the insulator layer.

4. The method of claim 1, further comprising:
    forming a trench fill in the trench after removal of the insulator layer.

5. The method of claim 1, wherein the trampoline support extends onto the handle substrate.

6. The method of claim 1, wherein the semiconductor layer is silicon and the strain inducing layer is silicon germanium.

7. The method of claim 1, wherein the trampoline support provides four trampoline supports that surround the strained trampoline.

8. A method comprising:
    forming a strain inducing layer on a silicon-on-insulator (SOI), the SOI is a silicon layer, a buried oxide (BOX) layer, and a handle substrate, wherein the silicon layer is on the BOX layer and the BOX layer is on the handle substrate;
    forming an opening through the silicon layer and through the BOX layer;
    forming a trampoline support in the opening;
    forming a trench in through the silicon layer and through the BOX layer, the trench is adjacent to the trampoline support, the silicon layer comprises a strained silicon trampoline with a boundary defined by the trampoline support and the trench; and removing the BOX layer from beneath the strained silicon trampoline wherein the trampoline support extends an entire side of the strained silicon trampoline, wherein the strained silicon trampoline is bordered on opposite sides by two trampoline supports and is bordered on adjacent sides by the trench, the trampoline supports and the trench define an entire boundary of the strained silicon trampoline.

9. The method of claim 8, further comprising:
removing the strain inducing layer; and
polishing the trampoline support to a top surface of the silicon layer.

10. The method of claim 8, further comprising:
forming a flowable oxide underneath the silicon layer through the trench after removal of the BOX layer.

11. The method of claim 8, further comprising:
forming a trench fill in the trench after removal of the BOX layer.

12. The method of claim 8, wherein the trampoline support extends onto the handle substrate.

13. The method of claim 8, wherein the strain inducing layer is silicon germanium.

14. The method of claim 8, wherein the trampoline support provides four trampoline supports that surround the strained silicon trampoline.

15. A structure comprising:
a strained trampoline comprising a silicon layer that is strained, having been formed on a sacrificial strain inducing layer of silicon germanium which has been removed, the strained trampoline physically held in a strained state by a trampoline support, the strained trampoline is vertically suspended by the trampoline support, wherein the strained trampoline is bordered on opposite sides by two trampoline supports and is bordered on adjacent sides by a trench, the trampoline supports and the trench define an entire boundary of the strained trampoline; and
a handle substrate physically supporting the trampoline support.

16. The structure of claim 15, wherein the trampoline support is a silicon.

17. The structure of claim 15, wherein the trampoline support provides four trampoline supports that surround the strained trampoline.

\* \* \* \* \*